United States Patent
Cui et al.

(10) Patent No.: US 7,588,036 B2
(45) Date of Patent: Sep. 15, 2009

(54) CHAMBER CLEAN METHOD USING REMOTE AND IN SITU PLASMA CLEANING SYSTEMS

(75) Inventors: Zhenjiang Cui, San Jose, CA (US); Michael S. Cox, Davenport, CA (US); Canfeng Lai, Fremont, CA (US); Paddy Krishnaraj, San Francisco, CA (US)

(73) Assignee: Applied Materials, Inc., Santa Clara, CA (US)

( * ) Notice: Subject to any disclaimer, the term of this patent is extended or adjusted under 35 U.S.C. 154(b) by 506 days.

(21) Appl. No.: 10/187,817

(22) Filed: Jul. 1, 2002

(65) Prior Publication Data

US 2004/0000321 A1    Jan. 1, 2004

(51) Int. Cl.
*B08B 7/00* (2006.01)
*B08B 7/04* (2006.01)

(52) U.S. Cl. .................. 134/1.1; 134/1; 134/30; 134/22.1; 134/22.18; 134/26; 438/905

(58) Field of Classification Search .......... 134/1, 134/1.1, 26, 30, 22.18, 22.1; 438/905
See application file for complete search history.

(56) References Cited

U.S. PATENT DOCUMENTS

| | | | |
|---|---|---|---|
| 4,820,377 A * | 4/1989 | Davis et al. ............... 134/1.1 |
| 5,016,663 A * | 5/1991 | Mase et al. ............... 134/1 |
| 5,154,512 A * | 10/1992 | Schietinger et al. ........ 374/9 |
| 5,166,080 A * | 11/1992 | Schietinger et al. ........ 438/7 |
| 5,449,411 A * | 9/1995 | Fukuda et al. ......... 118/723 MP |
| 5,454,903 A | 10/1995 | Redeker et al. |
| 5,620,526 A * | 4/1997 | Watatani et al. ........... 134/1.1 |
| 5,630,917 A | 5/1997 | Guo |
| 5,812,403 A | 9/1998 | Fong et al. |
| 5,843,239 A | 12/1998 | Shrotriya |
| 5,935,340 A * | 8/1999 | Xia et al. ................. 134/1.1 |
| 5,939,831 A | 8/1999 | Fong et al. |
| 6,055,927 A | 5/2000 | Shang et al. |
| 6,125,859 A * | 10/2000 | Kao et al. ................. 134/1.1 |
| 6,255,222 B1 | 7/2001 | Xia et al. |
| 6,274,058 B1 | 8/2001 | Rajagopalan et al. |
| 6,352,870 B1 * | 3/2002 | Lansford ................. 438/17 |
| 6,362,110 B1 * | 3/2002 | Marks .................... 438/711 |
| 6,366,346 B1 | 4/2002 | Nowak et al. |
| 6,374,831 B1 * | 4/2002 | Chandran et al. .......... 134/1.1 |
| 6,379,575 B1 * | 4/2002 | Yin et al. ................. 216/67 |
| 6,379,576 B2 * | 4/2002 | Luo et al. ................. 216/67 |
| 6,418,874 B1 | 7/2002 | Cox et al. |
| 6,435,197 B2 | 8/2002 | Shin et al. |

(Continued)

*Primary Examiner*—Alexander Markoff
(74) *Attorney, Agent, or Firm*—Townsend and Townsend and Crew LLP

(57) ABSTRACT

A process for removing unwanted deposition build-up from one or more interior surfaces of a substrate processing chamber. According to one embodiment the process comprises performing a substrate processing operation on the substrate within the substrate processing chamber and then transferring the substrate out of the substrate processing chamber; flowing a first etchant gas into a remote plasma source, forming reactive species from the etchant gas and transporting the reactive species into the substrate processing chamber to remove a first portion of the unwanted deposition build-up; and thereafter, flowing a second etchant gas into the substrate processing chamber and forming a plasma within the substrate processing chamber from the second gas in order to remove a second portion of the unwanted deposition build-up.

22 Claims, 5 Drawing Sheets

U.S. PATENT DOCUMENTS

| | | |
|---|---|---|
| 6,450,117 B1 | 9/2002 | Murugesh et al. |
| 6,562,700 B1 * | 5/2003 | Gu et al. ..................... 438/477 |
| 6,584,987 B1 | 7/2003 | Cheng et al. |
| 6,634,313 B2 * | 10/2003 | Hanawa et al. ......... 118/723 IR |
| 6,635,144 B2 * | 10/2003 | Cui et al. ............... 156/345.25 |
| 6,737,666 B1 * | 5/2004 | Ito et al. ..................... 250/574 |
| 6,872,323 B1 * | 3/2005 | Entley et al. .................. 216/67 |
| 7,159,594 B2 | 1/2007 | Kuhl et al. |
| 2002/0020429 A1 | 2/2002 | Selbrede et al. |
| 2002/0033183 A1 * | 3/2002 | Sun et al. ..................... 134/1.1 |
| 2003/0000546 A1 * | 1/2003 | Richardson et al. .......... 134/1.1 |
| 2003/0010355 A1 * | 1/2003 | Nowak et al. ................. 134/1.1 |

\* cited by examiner

US 7,588,036 B2

CHAMBER CLEAN METHOD USING REMOTE AND IN SITU PLASMA CLEANING SYSTEMS

BACKGROUND OF THE INVENTION

One of the primary steps in the fabrication of modern semiconductor devices is the formation of a layer, such as a silicon oxide layer, on a substrate or wafer. As is well known, such a layer can be deposited by chemical vapor deposition (CVD). In a conventional thermal CVD process, reactive gases are supplied to the substrate surface where heat-induced chemical reactions take place to form the desired film. In a conventional plasma CVD process, a controlled plasma is formed using, for example, radio frequency (RF) energy or microwave energy to decompose and/or energize reactive species in reactant gases to produce the desired film.

Unwanted deposition on areas such as the walls of the processing chamber also occurs during such CVD processes. As is known in the industry, it is common to remove the unwanted deposition material that builds up on the interior of chamber walls with an in situ chamber clean operation. Common chamber cleaning techniques include the use of an etchant gas, such as fluorine, to remove the deposited material from the chamber walls and other areas. In some processes, the etchant gas is introduced into the chamber and a plasma is formed so that the etchant gas reacts with and removes the deposited material from the chamber walls. Such cleaning procedures are commonly performed between deposition steps for every wafer or every n wafers.

Some semiconductor manufactures employ a remote plasma cleaning process as an alternative to an in situ plasma cleaning, a remote plasma cleaning procedure may be employed in which an etchant plasma is generated remote from the substrate processing chamber by a high density plasma source such as a microwave plasma system, toroidal plasma generator or similar device. Dissociated species from the etchant plasma are then transported to the substrate processing chamber where they can react with and etch away the undesired deposition build up. Remote plasma cleaning procedures are sometimes used by manufacturers because they provide a "softer" etch than in situ plasma cleans, i.e., there is less ion bombardment and/or physical damage to chamber components because the plasma is not in contact with chamber components.

One problem with some remote plasma cleaning processes, however, is that they require a higher volume of etchant gas than is required by some in situ cleaning processes. Accordingly, improvements to remote plasma cleaning processes are desirable.

BRIEF SUMMARY OF THE INVENTION

Embodiments of the invention pertain to techniques for removing unwanted deposition build-up from one or more interior surfaces of a substrate processing chamber after a substrate is processed in the chamber by, for example, depositing a layer of material over the substrate. Embodiments of the invention use a reduced amount of etchant gas as compared to some remote plasma cleaning processes.

According to one embodiment the process includes performing a substrate processing operation on the substrate within a substrate processing chamber and then transferring the substrate out of the substrate processing chamber; flowing a first etchant gas into a remote plasma source, forming reactive species from the etchant gas and transporting the reactive species into the substrate processing chamber to remove a first portion of the unwanted deposition build-up; and thereafter, flowing a second etchant gas into the substrate processing chamber and forming a plasma within the substrate processing chamber from the second gas in order to remove a second portion of the unwanted deposition build-up.

These and other embodiments of the invention along with many of its advantages and features are described in more detail in conjunction with the text below and attached figures.

DETAILED DESCRIPTION OF THE INVENTION

Embodiments of the present invention provide for an improved remote plasma cleaning process by reducing the amount of etchant gas required to clean unwanted deposition build-up off interior surfaces of a substrate processing chamber as compared to other remote plasma cleaning processes. Generally, remote plasma clean processes allow a higher gas dissociation rate at high gas flow rates as compared to in situ plasma clean processes. This higher ionization efficiency allows large volumes of clean gas to be flowed into the remote plasma chamber and thus leads to higher clean rates and reduced clean times as compared to in situ plasma clean processes.

Figure 1:
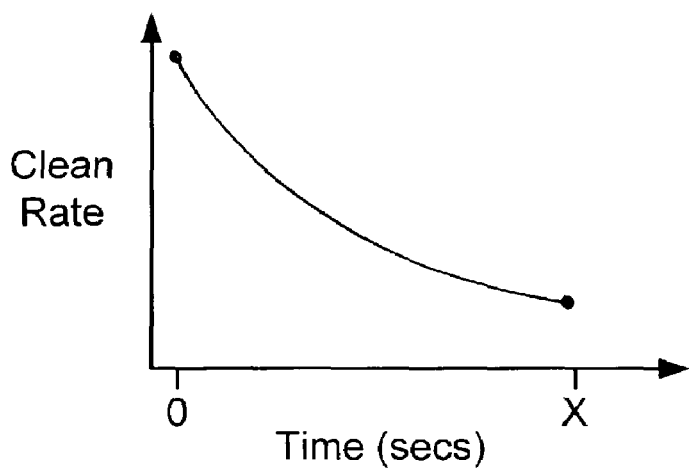
FIG. 1 is a graph illustrating that the clean rate of a remote plasma clean process decreases over time.

As shown in FIG. 1, however, the clean rate of a remote plasma clean process generally decreases over time as the process proceeds. At least part of the decrease in clean rate may be due to a decrease in the temperature of the chamber during the process. Typically, a remote clean process for a particular application is initiated shortly after a substrate processing operation is completed and the substrate is transferred out of the chamber. If the substrate processing operation resulted in heating the interior of the substrate processing chamber (e.g., due to the formation of an in situ plasma within the chamber), the temperature of the chamber will gradually decrease during the course of the remote plasma clean process. Part of the decrease in the clean rate may also be due to stronger bonds between the residue and the chamber walls, particularly around the corners of various chamber components, such as gas nozzles, substrate shields and the like. These stronger bonds, which are primarily associated with the initial layer of residue deposited on the walls and covered by subsequently formed residue, are harder to break and typically need to be broken near the end of the clean process. Thus, in order to effectively clean the substrate processing chamber in some applications, a remote plasma clean process will flow a considerable amount of reactive species (formed from a considerable volume of a reactive etchant gas) into the chamber to remove the last remnants of unwanted deposition build-up.

The inventors have developed an improved, multistep cleaning process that employs a remote plasma clean step during an initial portion of the cleaning process and follows that with an in situ plasma clean step during the latter portion of the cleaning process. This multistep process removes the final remnants of deposition build-up using a reduced volume of etchant gas as compared to a single step remote plasma clean process. The in situ plasma clean step also has the benefit of increasing the chamber temperature while the final residue remnants are being removed thus improving the effectiveness of the clean process in breaking the stronger bonds that may be associated with the final residue.

Figure 2:
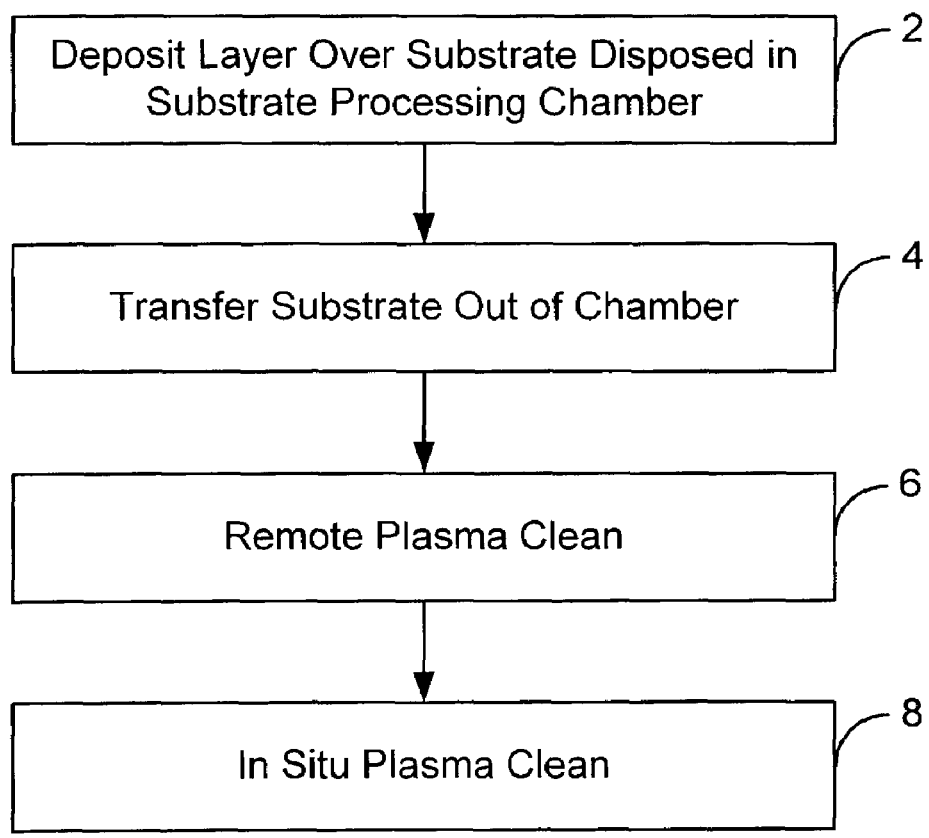
FIG. 2 is a flowchart depicting the steps associated with one embodiment of the present invention.

FIG. 2 is a flow chart depicting the steps according one embodiment of the present invention. As shown in FIG. 2, after a substrate deposition process or other type of substrate processing step (step 2) occurs in a substrate processing chamber, the substrate is transferred out of the chamber (step 4). Next, an etchant gas is introduced into an appropriate remote plasma source where the gas is ionized to form a plurality of reactive, dissociated species, such as fluorine-free radicals and other excited fluorine species. The reactive dissociated species are transported from the remote plasma chamber into the substrate processing chamber where they etch the unwanted deposition build-up to remove a first portion of residue from the chamber's interior as part of a first step of the chamber cleaning process (step 6).

After a predetermined period of time, a plasma is then formed within the substrate processing chamber (an in situ plasma) from an appropriate etchant gas in order to complete the chamber cleaning process (step 8). The in situ plasma heats the chamber and is generally more effective at removing stubborn residue remnants than is remote plasma clean step 6 on a per unit volume of etchant gas basis. In some embodiments, the formation of the in situ plasma occurs concurrent with or shortly after the remote plasma is extinguished and the flow of etchant gas into the remote plasma source is stopped. In these embodiments, the in situ plasma etchant gas, which may be the same or a different etchant than the one used during the remote plasma clean step, is introduced directly into the substrate processing chamber from a gas source. In other embodiments, however, power to the remote plasma source is stopped while the flow of the etchant gas through the remote plasma cleaning system continues so that the etchant gas used in remote plasma clean gas 6 is also the etchant gas used in in situ plasma clean step 8. In still other embodiments, an additional gas source, such an inert gas such as argon or helium or an oxygen-containing gas such as $O_2$ is introduced into the chamber along with the etchant gas in order to provide a sputtering element to the etch process thereby more rapidly heating the chamber to further improve the effectiveness of the process.

The inventors have found that the combination of a first remote plasma clean step with a subsequent in situ plasma clean increases the efficiency of the cleaning without sacrificing too many of the desirable benefits achieved by a solely "soft" remote plasma clean. As a result, etchant gas usage (e.g., $NF_3$) can be reduced significantly from the levels that may otherwise be required in a remote clean process to remove the same amount of deposition build-up. In some embodiments, remote plasma clean step 6 removes the majority of the unwanted residue build-up prior to initiating in situ plasma step 8. In these embodiments, it is typical for remote plasma clean step 6 to require between 60-80 percent of the total chamber cleaning time while in situ plasma step 8 requires between 20-40 percent of the total cleaning time.

In one embodiment implemented in an Ultima HDP-CVD chamber manufactured by Applied Materials and outfitted from 200 mm wafers, remote plasma cleaning step 6 flows $NF_3$ into a remote microwave plasma chamber at a rate of between 1500-3000 sccm while between 2000-4000 Watts of microwave power is applied to the remote plasma chamber to ionize the $NF_3$ gas. The reactive etchant species formed in the remote chamber are then transported into the substrate processing chamber by a pressure gradient formed by a mechanical (e.g., roughing) pump that keeps pressure within the chamber to a level between about 1-5 Torr. Then, during the in situ plasma clean, $NF_3$ flow is reduced to between 300-500 sccm and a turbo pump is used to maintain chamber pressure within a 5-100 mTorr range. This embodiment has the additional benefit removing particle build-up that may occur in the vicinity of the turbo pump as reactive species from the in situ plasma pass through the turbo pump. In contrast, in some previously known remote plasma cleaning processes, a separate, dedicated clean step was required to clean the turbo pump every two to seven times the chamber was cleaned.

In one embodiment the in situ plasma clean step forms a plasma within the chamber by applying between 10-20 KW of RF power to the source generators. In embodiments where an inert gas or other sputtering agent is employed, the in situ plasma is biased toward the substrate to induce an ion sputtering component to the etching process. In one embodiment, such a bias is formed by applying between 500-4000 Watts of RF energy (13.56 MHz) to the substrate holder. These ranges set forth above are for exemplary purposes only. A person of skill in the art will understand that gas flow rates, chamber pressure levels and RF and microwave power levels among other variables are in part chamber specific. Accordingly, other embodiments of the invention may use values outside of these ranges or may use different parameters altogether.

In some embodiments, in situ plasma clean step 8 is endpointed using timed or optical endpoint detection techniques as is known to those of skill in the art. In other embodiments, however, clean step 8 is stopped when the temperature of the plasma reaches a certain predetermined level. Such embodiments may employ the endpoint detection techniques described in U.S. application Ser. No. 09/833,437, filed Apr. 11, 2001, entitled "Apparatus and Method for Detecting an End Point of Chamber Cleaning in Semiconductor Equipment" having Zhenjiang Cui et al. listed as coinventors and is incorporated herein by reference in its entirety.

Figure 3:
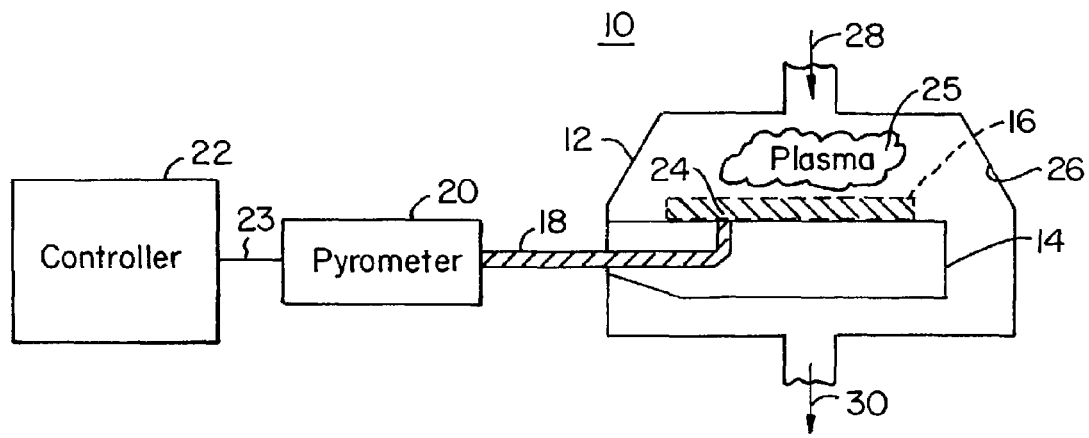
FIG. 3 is a schematic representation of a substrate processing apparatus in which the techniques of the present invention may be used.

FIG. 3 is a simplified schematic representation of a substrate processing system 10 that has the capability of endpointing plasma clean step 8 based on the temperature of the plasma. System 10 includes a sealed substrate processing chamber 12, a substrate support 14 adapted to hold a semiconductor wafer 16, a fiber optic cable 18, an optical pyrometer 20 and a computer controller 22 coupled to pyrometer 20 by a lead 23. While not shown in FIG. 3, controller 22 is also coupled to control other components of system 10, such as gas flow, plasma power levels, etc. Wafer 16 is shown in a dashed line because the wafer is positioned on substrate support 14 during substrate processing but not while the chamber is being cleaned during steps 6 and 8.

During chamber clean step 8, an etchant gas is continuously admitted into the chamber from, for example, the top and/or sides of the chamber (arrow 28) and a plasma 25 is formed within the chamber to etch unwanted residue that is formed on sidewalls 26 and other areas and components of the chamber. Unreacted etchant gas and etch byproducts are exhausted from the chamber through an exhaust line (arrow 30). During the cleaning process, end 24 of fiber optic cable 18 is uncovered so that pyrometer 20 is able to directly measure the temperature of the plasma 25. Controller 22 takes a continuing record of the measured temperatures in order to determine when the optimal endpoint for the cleaning process is reached. An example of temperature measurements taken by pyrometer 20 during one particular chamber cleaning process is shown in FIG. 4.

Figure 4:
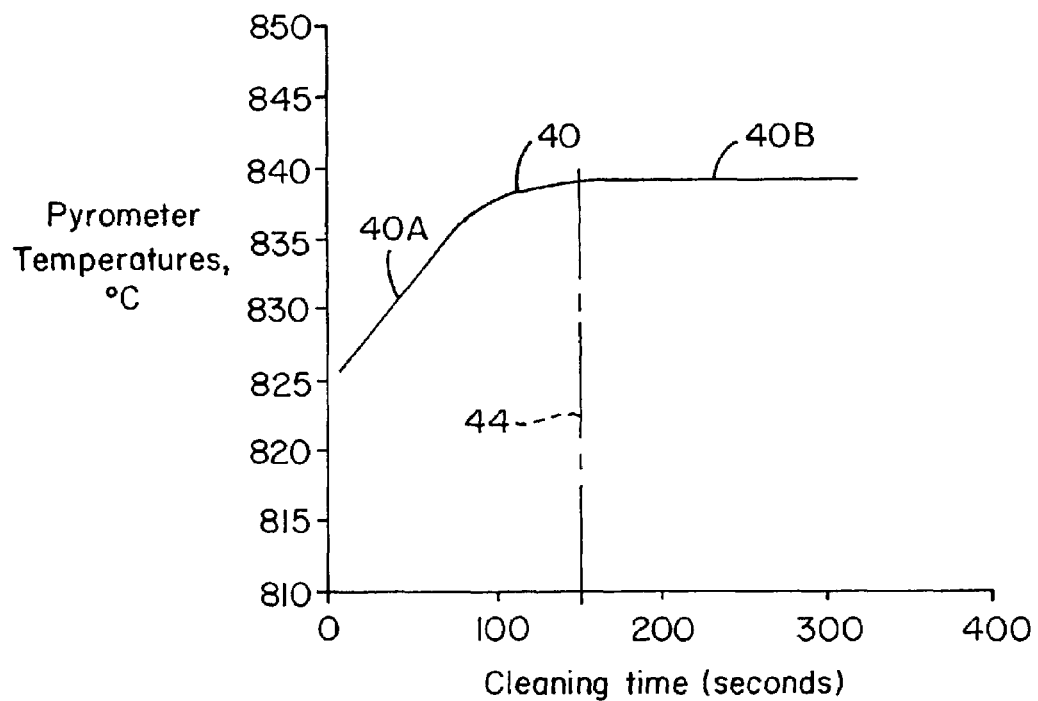
FIG. 4 is an exemplary graph illustrating the effect of time on the temperature of an in situ plasma excited cleaning gas.

Referring now to FIG. 4, there is shown a graph of temperature measurements by pyrometer 20 of plasma 25 versus time within chamber 12 with the y-axis being the pyrometer 20 temperature in degrees C. and the x-axis being the cleaning time in seconds. Curve 40 shown in FIG. 4 has an upwardly extending portion 40A, starting near time "0" (zero) and extending upward from about 825° C. temperature to a value of about 840° C. at about 150 seconds later, and a relatively flat portion 40B from 150 seconds and forward in time. This illustrates how plasma temperature initially increases and then levels off at a steady-state value (level plateau).

In the example given in FIG. 4, the temperature steady-state value of about 840° C. shows that cleaning within the chamber 12 has progressed to an end point (i.e., all deposits have been removed from inside the chamber 12). This is indicated in FIG. 4 by a dashed vertical line 44, occurring about 150 seconds after cleaning began. At such end point the cleaning process is automatically terminated by the computer 22 as was explained above.

It is to be noted that the times and temperatures occurring during the cleaning process can differ from those shown in FIG. 4 depending on the composition of the cleaning gas or gases employed, the power levels used to form the plasma, the pressure within the chamber 12, the kind and amount of residue being cleaned away, etc. It is also to be noted that the temperature of a wafer during processing may be, for example, only about 300° C. to 500° C., whereas the plasma-excited gas temperatures are much higher. Optical pyrometer 20 is capable of accurately reading temperatures over a ranges of about 200° C. to 900° C. and can be designed to cover any range depending on the power used in the plasma. By way of example, the pyrometer 20 is a Model 2000 Optical Fiber Thermometer, made by Sekidenko. This model 2000 has three 1020 nm (nanometer) channels and one 9050 nm calibration channel.

Figure 5:
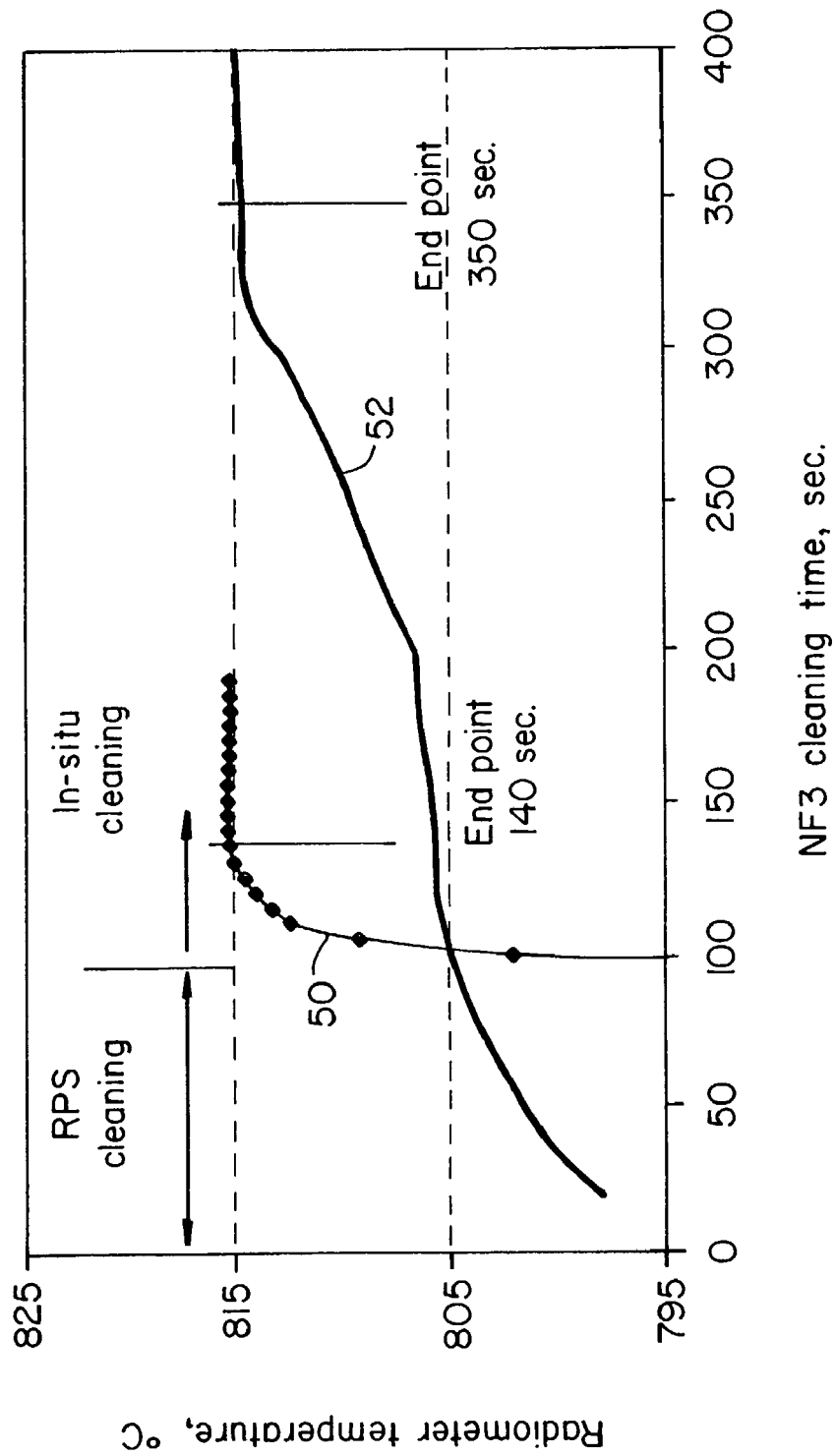
FIG. 5 is a graph comparing the cleaning time of one embodiment of a two-step clean process in accordance with the method of the invention with the cleaning time of a previously known in situ plasma cleaning process.

FIG. 5 is a graph that compares the amount of time required to clean equal amounts of unwanted residue from the interior of a substrate processing chamber using the techniques of the present invention (line 50) and using a previously known single step in situ plasma cleaning step (line 52) that does not employ the techniques of the present invention. Both processes use $NF_3$ as the etchant gas. As shown in FIG. 5, previously known in situ plasma cleaning process 52, which does not include an initial remote plasma cleaning step, does not reach an endpoint (i.e., achieve adequate cleaning of the interior chamber surfaces) until after almost six minutes of cleaning (350 seconds).

In contrast, by employing the method of the invention, which includes an initial 95 second remote plasma cleaning step in this example, process 50 requires a total of only 140 seconds to achieve substantially the same cleaning results. As shown in FIG. 5, the endpoint of inventive process 50, which during the in situ plasma portion uses an identical $NF_3$ flow rate and RF power levels as the in situ plasma in previously known process 52, is reached after just 45 seconds of the in situ plasma clean step. It is worth noting that while a single step remote plasma cleaning process can achieve adequate cleaning of the chamber in this example after only about 130 seconds (10 seconds less than inventive process 50), such a process uses a considerably higher volume of $NF_3$ than does process 50 even when taking the 10 second reduction in time into consideration.

Embodiments of the present invention can be implemented using a variety of substrate processing chambers providing the chambers have the capability creating reactive etch species within the chamber by forming an etchant plasma within the chamber (an in situ plasma) and by transporting remotely dissociated reactive species into the chamber from a remote plasma source in fluid communication with the chamber. An example of an inductively-coupled HDP-CVD chamber in which some embodiments of the method of the present invention can be practiced is set forth below. It is to be understood that the following chamber description is for exemplary purposes only as the techniques of the present invention can be used in a variety of other plasma chambers including PECVD chambers and ECR-HDP chambers among others.

Figure 6A:
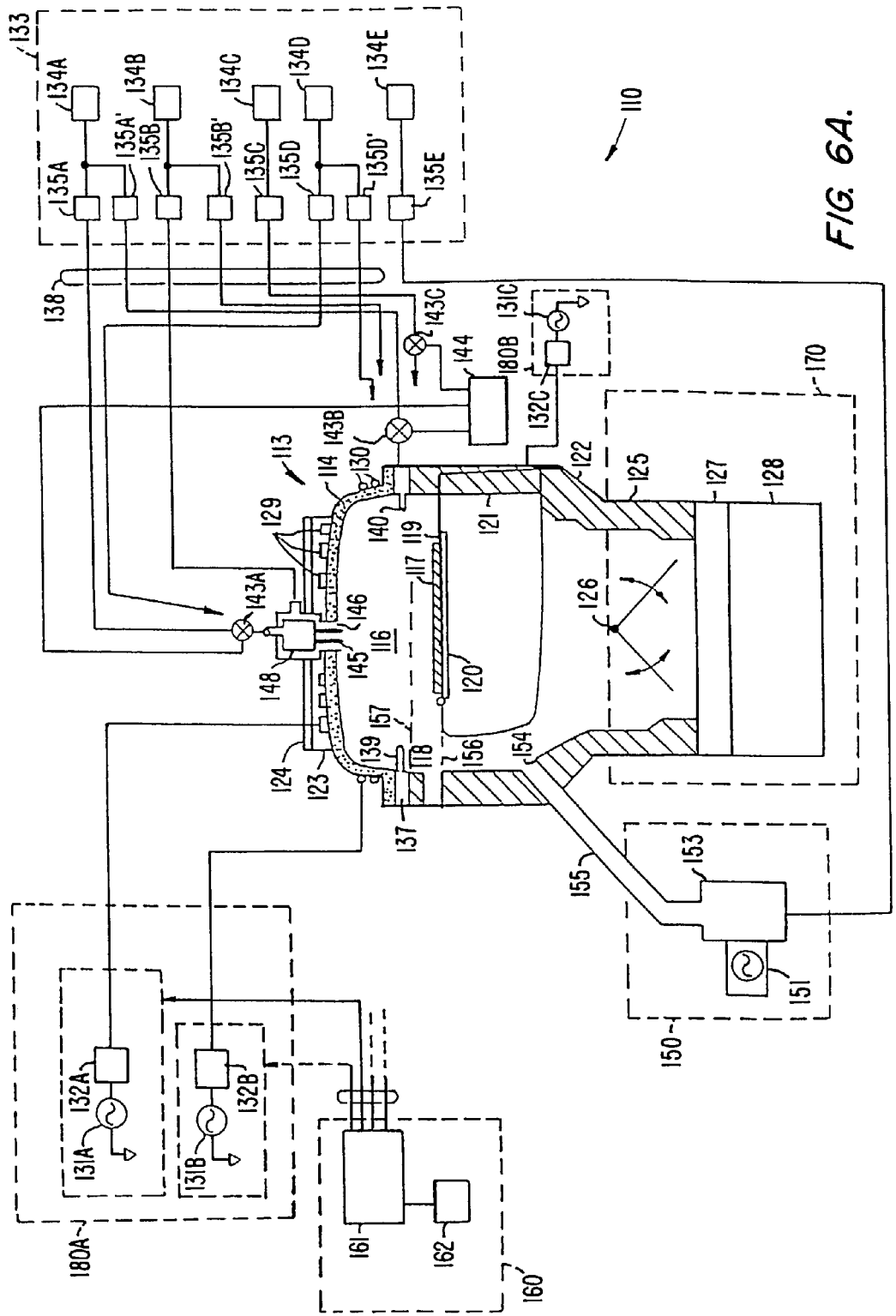
FIG. 6A is a simplified, cross-sectional view of an exemplary substrate processing system with which embodiments of the present invention may be used.

FIG. 6A illustrates one embodiment of a high density plasma chemical vapor deposition (HDP-CVD) system 110 in which the chamber cleaning techniques according to the present invention can be employed. System 110 includes a chamber 113, a substrate support 118, a gas delivery system 133, a remote plasma cleaning system 150, a vacuum system 170, a source plasma system 180A, a bias plasma system 180B.

The upper portion of chamber 113 includes a dome 114, which is made of a ceramic dielectric material, such as aluminum oxide or aluminum nitride. Dome 114 defines an upper boundary of a plasma processing region 116. Plasma processing region 116 is bounded on the bottom by the upper surface of a substrate 117 and a substrate support 118, which is also made from an aluminum oxide or aluminum ceramic material.

A heater plate 123 and a cold plate 124 surmount, and are thermally coupled to, dome 114. Heater plate 123 and cold plate 124 allow control of the dome temperature to within about ±10° C. over a range of about 100° C. to 200° C. Generally, exposure to the plasma heats a substrate positioned on substrate support 118. Substrate support 118 includes inner and outer passages (not shown) that can deliver a heat transfer gas (sometimes referred to as a backside cooling gas) to the backside of the substrate.

The lower portion of chamber 113 includes a body member 122, which joins the chamber to the vacuum system. A base portion 121 of substrate support 118 is mounted on, and forms a continuous inner surface with, body member 122. Substrates are transferred into and out of chamber 113 by a robot blade (not shown) through an insertion/removal opening (not shown) in the side of chamber 113. Lift pins (not shown) are raised and then lowered under the control of a motor (also not shown) to move the substrate from the robot blade at an upper loading position 157 to a lower processing position 156 in which the substrate is placed on a substrate receiving portion 119 of substrate support 118. Substrate receiving portion 119 includes an electrostatic chuck 120 that can be used to secure the substrate to substrate support 118 during substrate processing.

Vacuum system 170 includes throttle body 125, which houses twin-blade throttle valve 126 and is attached to gate valve 127 and turbo-molecular pump 128. Gate valve 127 can isolate pump 128 from throttle body 125, and can also control chamber pressure by restricting the exhaust flow capacity when throttle valve 126 is fully open. The arrangement of the throttle valve, gate valve, and turbo-molecular pump allow accurate and stable control of chamber pressures as low as about 1 mTorr.

Source plasma system 180A is coupled to a top coil 129 and side coil 130, mounted on dome 114. A symmetrical ground shield (not shown) reduces electrical coupling between the coils. Top coil 129 is powered by top source RF (SRF) generator 131A, whereas side coil 130 is powered by side SRF generator 131B, allowing independent power levels and frequencies of operation for each coil. In a specific embodiment, the top source RF generator 131A provides up to 2,500 watts of RF power at nominally 2 MHz and the side source RF generator 131B provides up to 5,000 watts of RF power at nominally 2 MHz. The operating frequencies of the top and side RF generators may be offset from the nominal operating frequency (e.g. to 1.7-1.9 MHz and 1.9-2.1 MHz, respectively) to improve plasma-generation efficiency.

A bias plasma system 180B includes a bias RF (BRF) generator 131C and a bias matching network 132C. The bias plasma system 180B capacitively couples substrate portion 117 to body member 122, which act as complimentary electrodes. The bias plasma system 180B serves to enhance the transport of plasma species (e.g., ions) created by the source plasma system 180A to the surface of the substrate. In a specific embodiment, bias RF generator provides up to 5,000 watts of RF power at 13.56 MHz.

RF generators 131A and 131B include digitally controlled synthesizers and operate over a frequency range between about 1.8 to about 2.1 MHz. Each generator includes an RF control circuit (not shown) that measures reflected power from the chamber and coil back to the generator and adjusts the frequency of operation to obtain the lowest reflected power, as understood by a person of ordinary skill in the art. Matching networks 132A and 132B match the output impedance of generators 131A and 131B with their respective coils 129 and 130. The RF control circuit may tune both matching networks by changing the value of capacitors within the matching networks to match the generator to the load as the load changes. The RF control circuit may tune a matching network when the power reflected from the load back to the generator exceeds a certain limit. One way to provide a constant match, and effectively disable the RF control circuit from tuning the matching network, is to set the reflected power limit above any expected value of reflected power. This may help stabilize a plasma under some conditions by holding the matching network constant at its most recent condition.

A gas delivery system 133 provides gases from several sources 134(a) . . . 134(n) via gas delivery lines 138 (only some of which are shown). In the particular example illustrated below, gas sources 134(a) . . . 134(n) include separate sources for $SiH_4$, $O_2$, Ar and $NF_3$ as well as one or more sources for the extended cleaning process. As would be understood by a person of skill in the art, the actual sources used for sources 134(a) . . . 134(n) and the actual connection of delivery lines 138 to chamber 113 varies depending on the deposition and cleaning processes executed within chamber 113. Gas flow from each source 134(a) . . . 134(n) is controlled by one or more mass flow controllers (not shown) as is known to those of skill in the art.

Figure 6B:
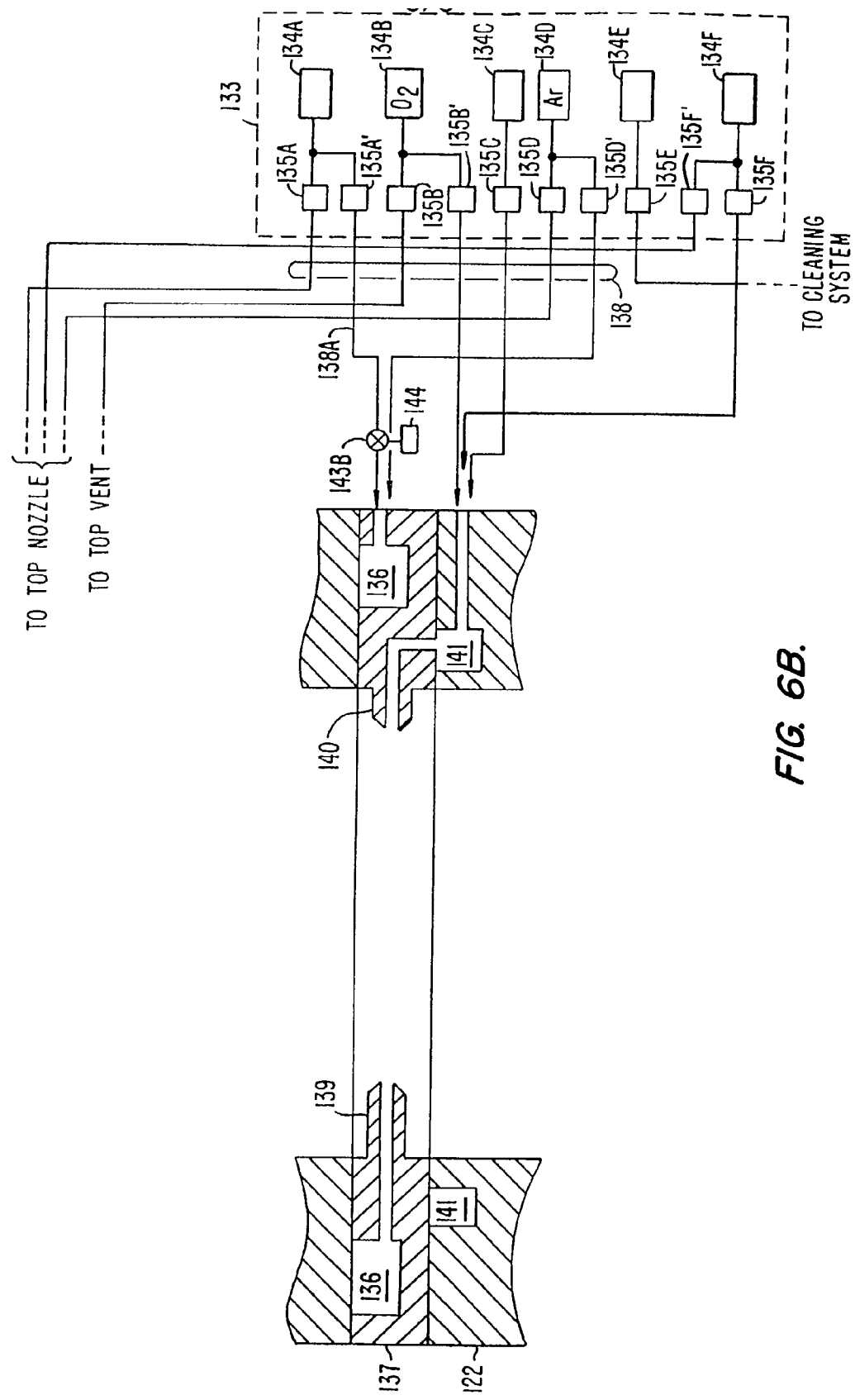
FIG. 6B is a simplified cross-sectional view of a gas ring that may be used in conjunction with the exemplary CVD processing chamber of FIG. 6A.

Gases are introduced into chamber 113 through a gas ring 137 and/or a top nozzle 145. FIG. 6B is a simplified, partial cross-sectional view of chamber 113 showing additional details of gas ring 137. In some embodiments, one or more gas sources provide gas to ring plenum 136 in gas ring 137 via gas delivery lines 138 (only some of which are shown). Gas ring 137 has a plurality of gas nozzles 139 (only one of which is shown for purposes of illustration) that provides a uniform flow of gas over the substrate. Nozzle length and nozzle angle may be changed to allow tailoring of the uniformity profile and gas utilization efficiency for a particular process within an individual chamber. In one specific embodiment, gas ring 137 has 24 gas nozzles 139 made from an aluminum oxide ceramic.

Gas ring 137 also has a plurality of gas nozzles 140 (only one of which is shown), which in a specific embodiment are co-planar with and shorter than source gas nozzles 139, and in one embodiment receive gas from body plenum 141. Gas nozzles 139 and 140 are not fluidly coupled in some embodiments where it is desirable to not mix gases (e.g., $SiH_4$ and $O_2$) introduced through gas ring 137 before injecting the gases into chamber 113. In other embodiments, gases may be mixed prior to injecting the gases into chamber 113 by providing apertures (not shown) between body plenum 141 and gas ring plenum 136. Additional valves, such as 143B (other valves not shown), may shut off gas from the flow controllers to the chamber.

In embodiments where flammable, toxic, or corrosive gases are used, it may be desirable to eliminate gas remaining in the gas delivery lines after a deposition or cleaning process. This may be accomplished using a 3-way valve, such as valve 143B, to isolate chamber 113 from a delivery line 138 and to vent delivery line 138 to vacuum foreline 144, for example. As shown in FIG. 6A, other similar valves, such as 143A and 143C, may be incorporated on other gas delivery lines. Such 3-way valves may be placed as close to chamber 113 and remote plasma source 150 as practical, to minimize the volume of the unvented gas delivery line (between the 3-way valve and the chamber). Additionally, two-way (on-off) valves (not shown) may be placed between a mass flow controller ("MFC") and the chamber or between a gas source and an MFC.

Referring again to FIG. 6A, chamber 113 also has top nozzle 145 and top vent 146. Top nozzle 145 and top vent 146 allow independent control of top and side flows of the gases, which improves film uniformity and allows fine adjustment of the film's deposition and doping parameters. Top vent 146 is an annular opening around top nozzle 145. In one embodiment, one source, e.g., $SiH_4$, supplies source gas nozzles 139 and top nozzle 145 through separate MFCs (not shown). Similarly, separate MFCs may be used to control the flow of oxygen to both top vent 146 and gas nozzles 140 from a single source of oxygen. The gases supplied to top nozzle 145 and top vent 146 may be kept separate prior to flowing the gases into chamber 113, or the gases may be mixed in top plenum 148 before they flow into chamber 113. In other embodiments, separate sources of the same gas may be used to supply various portions of the chamber.

A remote plasma cleaning system, such as a microwave plasma source 150 (or a torodial plasma source in other embodiments), is provided to periodically clean deposition residues from chamber components in a dry cleaning operation. The cleaning system includes a remote plasma generator 151 that creates a plasma from one or more cleaning gas source in sources 134(a) . . . 134(n) (e.g., molecular fluorine, nitrogen trifluoride, other fluorocarbons or equivalents alone or in combination with another gas such as Argon) in reactor cavity 153. The reactive species resulting from this plasma are conveyed to chamber 113 through cleaning gas feed port 154 via applicator tube 155. The materials used to contain the cleaning plasma (e.g., cavity 153 and applicator tube 155) must be resistant to attack by the plasma. The distance between reactor cavity 153 and feed port 154 should be kept as short as practical, since the concentration of desirable plasma species may decline with distance from reactor cavity 153. Generating the cleaning plasma in a remote cavity does not subject chamber components to the temperature, radiation, or bombardment of the glow discharge that may be present in a plasma formed in situ. Consequently, relatively sensitive components, such as electrostatic chuck 120, do not need to be covered with a dummy wafer or otherwise protected, as may be required with an in situ plasma cleaning process.

System controller 160 controls the operation of system 110. Controller 160 may include, for example, a memory 162, such as a hard disk drive and/or a floppy disk drive and a card rack coupled to a processor 161. The card rack may contain a single-board computer (SBC), analog and digital input/output boards, interface boards and stepper motor controller boards. System controller 160 operates under the control of a computer program stored on the hard disk drive or through other computer programs, such as programs stored on a removable disk. The computer program dictates, for example, the timing, mixture of gases, RF power levels and other parameters of a particular process.

Having fully described several embodiments of the present invention, many other equivalents or alternative embodiments of the present invention will be apparent to those skilled in the art. For example, while the invention was described with respect to cleaning CVD chambers it may also be used to clean other types of chambers, including etch chambers, where appropriate. Also, why the examples set forth above all used $NF_3$ as the etchant gases other etchant gases may be used in other embodiments. As such, the above description is illustrative and not restrictive. These equivalents and/or alternatives are intended to be included within the scope of the present invention.

What is claimed is:

1. A process for removing unwanted deposition build-up from one or more interior surfaces of a HDP-CVD substrate processing chamber, said process comprising:
   performing a substrate processing operation on the substrate within the HDP-CVD substrate processing chamber and then transferring the substrate out of the HDP-CVD substrate processing chamber;
   flowing a first etchant gas including a first fluorine-containing source into a remote plasma source, forming reactive species within the remote plasma source from the first etchant gas and transporting the reactive species into the HDP-CVD substrate processing chamber to remove a first portion of the unwanted deposition build-up at a first temperature;
   extinguishing the remote plasma source;
   thereafter, flowing a second etchant gas including a second fluorine-containing source into the HDP-CVD substrate processing chamber and forming an RF plasma within the HDP-CVD substrate processing chamber from the second etchant gas in order to remove a second portion of the unwanted deposition build-up at a second temperature;
   performing a temperature-based endpoint detection process; and
   terminating the removal of the second portion of the unwanted deposition build-up in response to the temperature-based endpoint detection process.

2. The process of claim 1 wherein the first etchant gas and the second etchant gas comprise the same fluorine-containing source.

3. The process of claim 1 wherein the second etchant gas comprises a fluorine-containing source and an inert gas.

4. The process of claim 1 wherein the remote plasma source is a microwave plasma source.

5. The process of claim 1 wherein the remote plasma source is a toroidal plasma source.

6. A process for removing unwanted deposition build-up from one or more interior surfaces of a HDP-CVD substrate processing chamber, said process comprising:
   depositing a layer of material over a substrate disposed in the HDP-CVD substrate processing chamber;
   transferring the substrate out of the HDP-CVD substrate processing chamber;
   flowing a first etchant gas including a first fluorine-containing source into a remote plasma source, forming reactive species within the remote plasma source from the first etchant gas and transporting the reactive species into the HDP-CVD substrate processing chamber to remove a first portion of the unwanted deposition build-up at a first temperature;
   flowing a second etchant gas including a second fluorine-containing source into the HDP-CVD substrate processing chamber and forming an RF plasma within the HDP-CVD substrate processing chamber from the second etchant gas in order to remove a second portion of the unwanted deposition build-up at a second temperature, wherein forming the plasma within the HDP-CVD substrate processing chamber occurs concurrent with extinguishing the remote plasma source;
   performing a temperature-based endpoint detection process; and
   terminating the removal of the second portion of the unwanted deposition build-up in response to the temperature-based endpoint detection process.

7. The process of claim 6 wherein reactive species are formed in the remote plasma source for a first length of time and a plasma is formed within the HDP-CVD substrate processing chamber for a second length of time, the first length of time being at least as long as and up to three times longer than the second length of time.

8. The process of claim 7 wherein the first etchant gas and second etchant gas each comprise the same fluorine-containing source.

9. The process of claim 8 wherein the fluorine-containing source is $NF_3$.

10. The process of claim 7 wherein the second etchant gas comprises a fluorine-containing source and an inert gas.

11. The process of claim 7 wherein the remote plasma source is a microwave plasma source.

12. The process of claim 7 wherein the remote plasma source is a toroidal plasma source.

13. The process of claim 1 wherein the remote plasma source is extinguished while continuing the flow of the first etchant gas.

14. The process of claim 1 wherein the second etchant gas comprises an inert gas or an oxygen-containing gas.

15. A process for cleaning a HDP-CVD substrate processing chamber, the process comprising:
   performing a substrate deposition operation on a substrate within the HDP-CVD substrate processing chamber, wherein the substrate deposition operation produces deposition build-up on one or more interior surfaces of the HDP-CVD substrate processing chamber;
   transferring the substrate out of the HDP-CVD substrate processing chamber;
   performing a remote plasma cleaning process to remove a first portion of the deposition build-up at a first temperature, the remote plasma cleaning process utilizing reactive species formed from a fluorine-containing source in a remote plasma source;
   extinguishing the remote plasma source;
   performing an in situ RF plasma cleaning process to remove a second portion of the deposition buildup at a second temperature, the in situ RF plasma cleaning process utilizing a plasma formed from the fluorine-containing source within the HDP-CVD substrate processing chamber;

performing a temperature-based endpoint detection process; and terminating the in situ RF plasma cleaning process in response to the temperature-based endpoint detection process.

16. The process of claim 15 wherein the remote plasma cleaning process is terminated prior to performing the in situ RF plasma cleaning process.

17. The process of claim 15 wherein an etchant gas utilized during the in situ RF plasma cleaning process is introduced directly into the HDP-CVD substrate processing chamber from a gas source.

18. The process of claim 1 wherein the second etchant gas comprises a fluorine-containing source and an oxygen-containing gas.

19. The process of claim 7 wherein the second etchant gas comprises a fluorine-containing source and an oxygen-containing gas.

20. The process of claim 1 wherein performing a temperature-based endpoint detection process comprises:
measuring a temperature of the plasma within the HDP-CVD substrate processing chamber at a first time;
measuring the temperature of the plasma within the HDP-CVD substrate processing chamber at a first time; and
determining that temperature of the plasma within the HDP-CVD substrate processing chamber has reached a steady-state value.

21. The process of claim 20 wherein measuring a temperature of the plasma within the HDP-CVD substrate processing chamber at a first time comprises using an optical pyrometer.

22. The process of claim 1 wherein terminating the removal of the second portion of the unwanted deposition build-up comprises terminating the flow of the second etchant gas.

* * * * *

UNITED STATES PATENT AND TRADEMARK OFFICE
CERTIFICATE OF CORRECTION

PATENT NO. : 7,588,036 B2
APPLICATION NO. : 10/187817
DATED : September 15, 2009
INVENTOR(S) : Cui et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 684 days.

Signed and Sealed this

Twenty-first Day of September, 2010

David J. Kappos
*Director of the United States Patent and Trademark Office*